(12) United States Patent
Dasgupta et al.

(10) Patent No.: US 11,177,376 B2
(45) Date of Patent: *Nov. 16, 2021

(54) III-N EPITAXIAL DEVICE STRUCTURES ON FREE STANDING SILICON MESAS

(71) Applicant: Intel Corporation, Santa Clara, CA (US)

(72) Inventors: Sansaptak Dasgupta, Hillsboro, OR (US); Han Wui Then, Portland, OR (US); Sanaz K. Gardner, Hillsboro, OR (US); Marko Radosavljevic, Beaverton, OR (US); Seung Hoon Sung, Beaverton, OR (US); Benjamin Chu-Kung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 239 days.

This patent is subject to a terminal disclaimer.

(21) Appl. No.: 16/258,422

(22) Filed: Jan. 25, 2019

(65) Prior Publication Data
US 2019/0172938 A1 Jun. 6, 2019

Related U.S. Application Data

(63) Continuation of application No. 15/505,911, filed as application No. PCT/US2014/057474 on Sep. 25, 2014, now Pat. No. 10,229,991.

(51) Int. Cl.
*H01L 29/778* (2006.01)
*H01L 29/66* (2006.01)
(Continued)

(52) U.S. Cl.
CPC ...... *H01L 29/7786* (2013.01); *H01L 21/0243* (2013.01); *H01L 21/0254* (2013.01);
(Continued)

(58) Field of Classification Search
CPC ............... H01L 29/7786; H01L 21/02381
(Continued)

(56) References Cited

U.S. PATENT DOCUMENTS 4,961,194 A   10/1990   Kuroda et al.
5,367,183 A   11/1994   Perea et al.
(Continued)

FOREIGN PATENT DOCUMENTS

CN   1279733   1/2001
CN   1409868   4/2003
(Continued)

OTHER PUBLICATIONS

Guo, Jia et al., "MBE-Regrown Ohmics in InAlN HEMTs With a Regrowth Interface Resistance of 0.05Ω * mm", IEEE Electron Device Letters, vol. 33, No. 4, Apr. 2012, 3 pgs.
(Continued)

*Primary Examiner* — Lex H Malsawma
*Assistant Examiner* — Xia L Cross
(74) *Attorney, Agent, or Firm* — Green, Howard & Mughal LLP

(57) ABSTRACT

III-N semiconductor heterostructures on III-N epitaxial islands laterally overgrown from a mesa of a silicon substrate. An IC may include a III-N semiconductor device disposed on the III-N epitaxial island overhanging the silicon mesa and may further include a silicon-based MOSFET monolithically integrated with the III-N device. Lateral epitaxial overgrowth from silicon mesas may provide III-N semiconductor regions of good crystal quality upon which transistors or other active semiconductor devices may be fabricated. Overhanging surfaces of III-N islands may provide multiple device layers on surfaces of differing polarity. Spacing between separate III-N islands may provide mechanical compliance to an IC including III-N semicon-
(Continued)

ductor devices. Undercut of the silicon mesa may be utilized for transfer of III-N epitaxial islands to alternative substrates.

13 Claims, 12 Drawing Sheets

(51) Int. Cl.
H01L 21/02 (2006.01)
H01L 29/417 (2006.01)
H01L 29/06 (2006.01)

(52) U.S. Cl.
CPC .... *H01L 21/0265* (2013.01); *H01L 21/02381* (2013.01); *H01L 21/02433* (2013.01); *H01L 21/02639* (2013.01); *H01L 29/66462* (2013.01); *H01L 29/0657* (2013.01); *H01L 29/41725* (2013.01)

(58) Field of Classification Search
USPC ........................................................ 257/192
See application file for complete search history.

(56) References Cited

U.S. PATENT DOCUMENTS

| | | | |
|---|---|---|---|
| 6,121,153 A | 9/2000 | Kikkawa |
| 6,225,196 B1 | 5/2001 | Yokoyama |
| 6,261,929 B1 | 7/2001 | Gehrke et al. |
| 6,325,850 B1 | 12/2001 | Beaumont et al. |
| 6,521,514 B1 | 2/2003 | Gehrke et al. |
| 6,608,327 B1 | 8/2003 | Davis et al. |
| 6,617,668 B1 | 9/2003 | Koide et al. |
| 7,501,669 B2 | 3/2009 | Parikh et al. |
| 7,952,150 B1 | 5/2011 | Wohlmuth |
| 8,173,551 B2 | 5/2012 | Bai et al. |
| 8,313,967 B1 | 11/2012 | Lee et al. |
| 8,507,304 B2 | 8/2013 | Kryliouk et al. |
| 8,519,438 B2 | 8/2013 | Mishra et al. |
| 8,530,978 B1 | 9/2013 | Chu et al. |
| 8,569,769 B2 | 10/2013 | Hwang et al. |
| 8,629,477 B2 | 1/2014 | Lochtefeld et al. |
| 8,772,786 B2 | 7/2014 | Tabatabaie et al. |
| 8,836,016 B2 | 9/2014 | Wu et al. |
| 9,000,485 B2 | 4/2015 | Lee et al. |
| 9,117,777 B2 | 8/2015 | Vincent et al. |
| 9,153,583 B2 | 10/2015 | Glass et al. |
| 9,196,709 B2 | 11/2015 | Lee et al. |
| 9,240,410 B2 | 1/2016 | Then et al. |
| 10,056,456 B2 | 8/2018 | Then et al. |
| 10,229,991 B2 | 3/2019 | Dasgupta et al. |
| 10,325,774 B2 | 6/2019 | Dasgupta et al. |
| 2001/0040246 A1 | 11/2001 | Ishii |
| 2002/0110989 A1 | 8/2002 | Yamaguchi et al. |
| 2002/0152952 A1 | 10/2002 | Beaumont |
| 2003/0045017 A1 | 3/2003 | Hiramatsu et al. |
| 2004/0029365 A1 | 2/2004 | Linthicum et al. |
| 2004/0169192 A1 | 9/2004 | Kato et al. |
| 2006/0084245 A1 | 4/2006 | Khoda |
| 2006/0124962 A1 | 6/2006 | Ueda et al. |
| 2006/0181828 A1 | 8/2006 | Sato |
| 2006/0197129 A1 | 9/2006 | Wohlmuth |
| 2007/0045670 A1 | 3/2007 | Kuraguchi |
| 2007/0278507 A1 | 12/2007 | Nakazawa et al. |
| 2008/0036038 A1 | 2/2008 | Hersee et al. |
| 2008/0070355 A1 | 3/2008 | Lochtefeld et al. |
| 2008/0093622 A1 | 4/2008 | Li |
| 2008/0099785 A1 | 5/2008 | Bai |
| 2008/0127884 A1 | 6/2008 | Tischler et al. |
| 2008/0197358 A1* | 8/2008 | Frahm ............... H01L 21/02513 257/76 |
| 2009/0039361 A1 | 2/2009 | Li |
| 2009/0267078 A1 | 10/2009 | Mishra et al. |
| 2010/0012976 A1 | 1/2010 | Hydrick et al. |
| 2010/0012977 A1 | 1/2010 | Derluyn et al. |
| 2010/0068866 A1 | 3/2010 | Yu et al. |
| 2010/0072576 A1 | 3/2010 | Arena |
| 2010/0140735 A1 | 6/2010 | Bommena et al. |
| 2010/0207138 A1 | 8/2010 | Nakahata et al. |
| 2010/0213511 A1 | 8/2010 | Lochtefeld |
| 2010/0219452 A1 | 9/2010 | Brierley |
| 2010/0270559 A1 | 10/2010 | Ota |
| 2011/0037098 A1 | 2/2011 | Kim et al. |
| 2011/0079822 A1 | 4/2011 | Kanamura |
| 2011/0117726 A1 | 5/2011 | Pinnington et al. |
| 2011/0210377 A1 | 9/2011 | Haeberlen et al. |
| 2011/0272740 A1 | 11/2011 | Umeda et al. |
| 2011/0278945 A1 | 11/2011 | Wheatley, III et al. |
| 2011/0284865 A1 | 11/2011 | Inoue et al. |
| 2012/0119218 A1 | 5/2012 | Su et al. |
| 2012/0119220 A1 | 5/2012 | Guo et al. |
| 2012/0248500 A1 | 10/2012 | Kajitana |
| 2012/0292789 A1 | 11/2012 | Sazawa |
| 2012/0305992 A1 | 12/2012 | Marino et al. |
| 2013/0015460 A1 | 1/2013 | Chen et al. |
| 2013/0015525 A1 | 1/2013 | Cheng |
| 2013/0043468 A1 | 2/2013 | Adekore |
| 2013/0043485 A1 | 2/2013 | Ueno |
| 2013/0049013 A1 | 2/2013 | Shimada |
| 2013/0105808 A1 | 5/2013 | Wong et al. |
| 2013/0105810 A1 | 5/2013 | Nishimori et al. |
| 2013/0146893 A1 | 6/2013 | Thei et al. |
| 2013/0221409 A1 | 8/2013 | Nakajima et al. |
| 2013/0228809 A1 | 9/2013 | Chang et al. |
| 2013/0256679 A1 | 10/2013 | Yao et al. |
| 2013/0270579 A1 | 10/2013 | Yu et al. |
| 2013/0271208 A1 | 10/2013 | Then et al. |
| 2013/0277686 A1 | 10/2013 | Liu et al. |
| 2013/0307513 A1 | 11/2013 | Then et al. |
| 2013/0313561 A1 | 11/2013 | Suh |
| 2013/0320353 A1 | 12/2013 | Kryiouk et al. |
| 2013/0334538 A1 | 12/2013 | Saunier |
| 2014/0014966 A1 | 1/2014 | Tabatabaie et al. |
| 2014/0042446 A1 | 2/2014 | Chiang |
| 2014/0084300 A1 | 3/2014 | Okamoto |
| 2014/0091308 A1 | 4/2014 | Dasgupta et al. |
| 2014/0091310 A1 | 4/2014 | Jeon et al. |
| 2014/0091398 A1 | 4/2014 | Hata et al. |
| 2014/0091845 A1 | 4/2014 | Then et al. |
| 2014/0094223 A1 | 4/2014 | Dasgupta et al. |
| 2014/0110759 A1 | 4/2014 | Murata et al. |
| 2014/0203329 A1 | 7/2014 | Saitoh et al. |
| 2014/0239312 A1 | 8/2014 | Shatalov et al. |
| 2014/0252368 A1 | 9/2014 | Lee et al. |
| 2014/0264321 A1 | 9/2014 | Liang |
| 2014/0264379 A1 | 9/2014 | Kub et al. |
| 2014/0264380 A1 | 9/2014 | Kub et al. |
| 2015/0014820 A1 | 2/2015 | Renaud |
| 2015/0041820 A1 | 2/2015 | Renaud |
| 2015/0041860 A1 | 2/2015 | Nishimori et al. |
| 2015/0061075 A1 | 3/2015 | Yeh |
| 2015/0061078 A1 | 3/2015 | Abel et al. |
| 2015/0103977 A1 | 4/2015 | Ono et al. |
| 2015/0115325 A1 | 4/2015 | Vielemeyer |
| 2015/0144957 A1 | 5/2015 | Lu et al. |
| 2015/0206796 A1 | 7/2015 | Dasgupta et al. |
| 2015/0263223 A1 | 9/2015 | Ito |
| 2015/0318276 A1 | 11/2015 | Bayram et al. |
| 2015/0340482 A1 | 11/2015 | Padmanabhan et al. |
| 2016/0111496 A1 | 4/2016 | Leobandung |
| 2016/0204276 A1 | 7/2016 | Dasgupta et al. |
| 2016/0336437 A1 | 11/2016 | Kajitani et al. |
| 2017/0221999 A1 | 8/2017 | Dasgupta |
| 2017/0278959 A1 | 9/2017 | Then et al. |
| 2018/0175184 A1 | 6/2018 | Then et al. |

FOREIGN PATENT DOCUMENTS

| | | |
|---|---|---|
| CN | 102017160 | 4/2011 |
| CN | 102306658 | 1/2012 |
| CN | 102576663 | 7/2012 |
| CN | 103582938 | 2/2014 |
| EP | 1054442 | 11/2000 |

(56) References Cited

FOREIGN PATENT DOCUMENTS

| | | |
|---|---|---|
| JP | S5851575 | 3/1983 |
| JP | 11260835 | 9/1999 |
| JP | 2001230410 | 8/2001 |
| JP | 2002249400 | 9/2002 |
| JP | 200369010 | 3/2003 |
| JP | 2007165431 | 6/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2014078653 | 5/2014 |
| JP | 2014131028 | 7/2014 |
| JP | 2014192167 | 7/2016 |
| KR | 20120048244 | 5/2012 |
| KR | 20130046249 | 5/2013 |
| KR | 101410092 | 6/2014 |
| TW | 201415626 | 4/2014 |
| WO | 2011064997 | 6/2011 |
| WO | 2015047355 | 4/2015 |
| WO | 2015147816 | 10/2015 |
| WO | 2016043748 | 3/2016 |
| WO | 2016048328 | 3/2016 |
| WO | 2016209263 | 12/2016 |

OTHER PUBLICATIONS

Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.

Masui, Hisashi et al., "Geometrical Characteristics and Surface Polarity of Inclined Crystallographic Plane of the Wurzite and Zincblende Structures", Journal of Electronic Materials, vol. 38, No. 6, 2009.

Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.

Wan, J. et al., "Growth of Crack-Free Hexagonal GAN Films on SI (100)", Applied Physics Letters, USA, Jul. 18, 2001, Vo. 79, No. 10. p. 1459-1460, DOI: 10.1063/1.1400770.

Examination Report from Malaysian Patent Application No. PI2017700616 dated Apr. 15, 2020, 3 pgs.

Office Action from Chinese Patent Application No. 201480081456.3 dated Jan. 19, 2020, 18 pgs.

Office Action from Taiwan Patent Application No. 104127005 dated Jul. 29, 2019, 13 pgs.

Notice of Allowance from Chinese Patent Application No. 201480081456.3 dated Jul. 30, 2020, 7 pgs.

Office Action from Korean Patent Application No. 10-2017-7004736 dated Sep. 18, 2020, 5 pgs.

Ex Parte Quayle Action from U.S. Appl. No. 15/505,911 dated Jul. 31, 2018, 14 pgs.

Extended European Search Report from European Patent Application No. 14902679.1 dated Apr. 12, 2018, 7 pgs.

International Preliminary Report on Patentability from PCT/US2014/057474 dated Apr. 6, 2017, 8 pgs.

International Search Report & Written Opinion dated Jun. 22, 2015 for PCT Patent Application No. PCT/US2014/057474.

Notice of Allowance from Japanese Patent Application No. 2017-510500 dated Jun. 26, 2018, 2 pgs.

Notice of Allowance from U.S. Appl. No. 15/505,911 dated Nov. 1, 2018, 10 pgs.

Office Action from Taiwan Patent Application No. 104127005 dated Dec. 28, 2018, 13 pgs, no English translation available.

Katona, T.M. et al., "Control of crystallographic tilt in GaN grown on Si (111) by cantilever epitaxy", Applied Physics Letters, vol. 81, No. 19, Nov. 4, 2002, 3 pgs.

Notice of Allowance from Korean Patent Application No. 10-2017-7004736 dated Nov. 25, 2020, 4 pgs.

* cited by examiner

US 11,177,376 B2

III-N EPITAXIAL DEVICE STRUCTURES ON FREE STANDING SILICON MESAS

CLAIM FOR PRIORITY

This application is a continuation of, and claims priority to, U.S. patent application Ser. No. 15/505,911, filed on Feb. 22, 2017, entitled "III-N EPITAXIAL DEVICE STRUCTURES ON FREE STANDING SILICON MESAS," which is a National Stage Entry of, and claims priority to, PCT Application No. PCT/US2014/057474, filed on Sep. 25, 2014, entitled "III-N EPITAXIAL DEVICE STRUCTURES ON FREE STANDING SILICON MESAS," which is incorporated by reference in its entirety for all purposes.

TECHNICAL FIELD

Embodiments of the invention generally relate to control of defects within wurtzite materials heteroepitaxially formed on cubic substrates, and more particularly pertain to III-N semiconductor heterostructures laterally overgrown from silicon mesas.

BACKGROUND

Demand for integrated circuits (ICs) in portable electronic applications has motivated greater levels of semiconductor device integration. Many advanced semiconductor devices in development leverage non-silicon semiconductor materials, a subset of which have wurtzite crystallinity Exemplary wurtzite materials include AgI, ZnO, CdS, CdSe, α-SiC, BN, GaN, AlN, the last two of which may be grouped together as being in the III-N material system. The III-N material system shows particular promise for high voltage and high frequency applications like power management ICs and RF power amplifiers. III-N heterostructure field effect transistors (HFET), such as high electron mobility transistors (HEMT) and metal oxide semiconductor (MOS) HEMT, employ a semiconductor heterostructure with one or more heterojunction, for example at an interface of a GaN semiconductor and another III-N semiconductor alloy, such as AlGaN or AlInN GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

Multi-chip integration approaches have been employed to integrate silicon-based devices with those based on wurtzite semiconductor materials. These multi-chip approaches have scaling and performance limitations. Monolithic integration of silicon-based devices (e.g., CMOS field effect transistors) with devices utilizing wurtzite material systems is a challenge due to a large lattice mismatch (e.g., ~41% between GaN and Si) and a large thermal expansion coefficient mismatch (e.g., ~116% between Si and GaN). These mismatches can result in a great number of defects in the wurtzite semiconductor thin films epitaxially grown on silicon substrates. Without an ability to control propagation of defects, regions of sufficiently low defect density may not available to form highly functional semiconductor devices. One technique for monolithic integration relies on thick buffer layers, for example of 3-10 microns, or more. Such thick buffers however are expensive and complicate silicon CMOS integration. Structures and techniques to manage defect propagation in wurtzite material systems heteroepitaxially formed on CMOS-compatible substrates without thick buffers are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
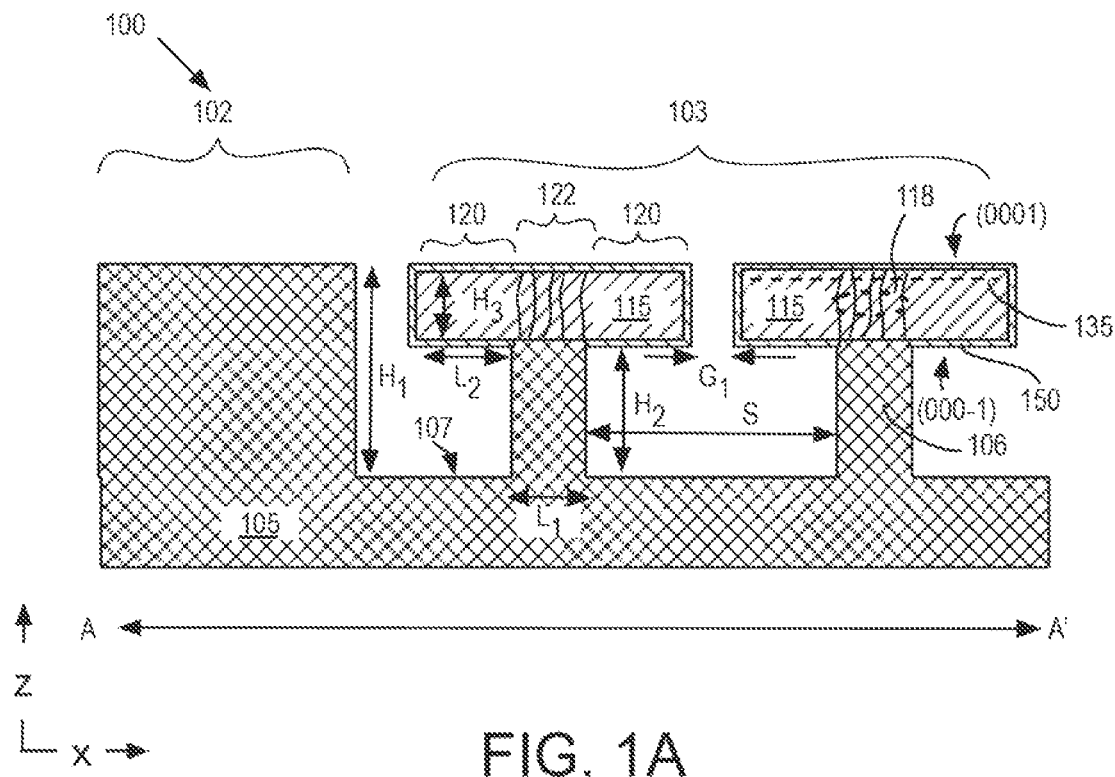
FIG. 1A is a cross-sectional view of a semiconductor heterostructure including a pair of III-N semiconductor islands disposed on top surfaces of a pair of silicon mesas, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are III-N (e.g., GaN) heterostructures disposed atop silicon mesas (e.g., pillars) that include peripheral III-N regions of sufficiently low defect density to be utilized for III-N transistors. Heterostructures in accordance with embodiments herein provide regions of good crystal quality without the need for thick buffers (e.g., of 1 μm or more). These same epi-mesa structures can also be utilized for layer transferring heteroepitaxial III-N islands having regions of high quality from a silicon growth substrate to other substrates. In further embodiments, the island-like III-N heterostructures are engendered with greater mechanical compliance than conventional buffer-based systems that are more brittle than silicon semiconductor systems. As such, the III-N heterostructures and devices described herein may be employed in flexible electronics, advantageous, for example, in wearable SoC products. In further embodiments, mesa structures and III-N heterostructures on the mesas may be fabricated as preparation of a first substrate region prior to a subsequent fabrication of silicon-based MOSFET in a second substrate region. Silicon-based MOSFET and III-N-based HFET processing may then proceed concurrently on a substantially planar substrate.

FIG. 1A is a cross-sectional view of a semiconductor heterostructure 100 including a pair of III-N semiconductor epitaxial islands 115 disposed on top surfaces of a first and second silicon mesa 106, in accordance with an embodiment. As shown, each mesa 106 is disposed in a first substrate region 103 that is recessed by a z-height $H_1$ relative to a top surface of a second substrate region 102. Each mesa 106 is a portion, or extension, of substrate 105, having the same crystallinity as substrate 105. Substrate 105 may be a variety of materials, including, but not limited to, silicon, germanium, and SiGe. In the exemplary embodiment substrate 105 is silicon, which is advantageous for monolithic integration of III-N devices in substrate region 103 with conventional silicon MOSFETs disposed on substrate region 102. Crystallographic orientation of a substantially monocrystalline substrate 105 may be any of (100), (111), or (110). Other crystallographic orientations are also possible. In one exemplary silicon substrate embodiment, substrate 105 is (100) silicon. For a (100) silicon substrate 105, the semiconductor surface may be miscut or offcut, for example 2-10° toward [110], to facilitate nucleation of III-N semiconductor islands 115 having hexagonal/wurtzite crystallinity.

Each mesa 106 extends from substrate 105 by a z-height $H_2$, and has a smallest lateral width (i.e., minimum CD) $L_1$. In exemplary embodiments, $L_1$ is between 200 nm and 5 µm, advantageously less than 1 µm, and more advantageously between 500 nm and 1 µm. For pillar embodiments, mesa 106 has a CD in the second dimension (e.g., y-dimension in FIG. 1A) that is also $L_1$, or approximately $L_1$. For line embodiments, mesa 106 has a CD in the second dimension that is at least many times $L_1$, and may even be many orders of magnitude larger than $L_1$. Orientation of the mesas may depend on substrate crystal orientation. In one exemplary embodiment with a (100) silicon substrate, mesa lines are oriented in a [110] direction to facilitate monolithic integration of III-N HFETs and silicon MOSFETs. The mesa height $H_2$ is advantageously less than recess depth $H_1$, permitting greater planarity between top surfaces of substrate regions 102 and 103. In the exemplary embodiment depicted in FIG. 1A, mesa height $H_2$ is less than recess depth $H_1$ by at least the III-N island z-thickness $H_3$. While mesa height $H_2$ may vary with implementation, in one exemplary embodiment wherein $L_1$ is between 500 nm and 1 µm, $H_3$ is at least 500 nm, and advantageously between 750 nm and 5 µm.

Each III-N epitaxial island 115 is a relaxed, substantially monocrystalline III-N semiconductor having the hexagonal/wurzite c-axis substantially orthogonal to the top mesa surfaces. While c-axis orthogonality is advantageous, it is noted that some miscut of substrate 105 may induce the c-axis to deviate a few degrees from orthogonal. In the exemplary embodiment III-N island 115 is GaN. Because of significant mismatch between III-N epitaxial island 115 and silicon mesa 106, epitaxial island 115 has a core region 122 disposed over mesa 106 that includes a number of defects 118 (e.g., threading dislocations), which glide in the [0001] direction with a minimal angle. In exemplary embodiments where III-N island 115 has a maximum thickness $H_3$ that is far less than that of a typical silicon-to-III-N buffer structure, defects 118 extend throughout the entire z-thickness of III-N island 115. In exemplary embodiments, $H_3$ is less than 1.3 µm, and in advantageous GaN embodiments, $H_3$ is no more 500 nm.

III-N epitaxial island 115 further includes a peripheral region 120 surrounding the core region 122. Peripheral region 120 extends laterally beyond sidewalls of silicon mesa 106 by overhang length $L_2$. While $L_2$ may vary with duration of lateral epitaxial overgrowth (LEO), in exemplary embodiments, $L_2$ is less than one-half the gap spacing $G_1$ between adjacent mesas 106, ensuring a non-zero gap spacing $G_1$ between sidewalls of adjacent III-N epitaxial islands 115. In one advantageous embodiment where $L_1$ is no more than 500 nm, $H_3$ is between 500 nm and 1 µm, $L_2$ is at least 500 nm. In embodiments where III-N epitaxial island 155 has the c-axis orthogonal to a top surface of mesa 106, peripheral region 120 has n-plane sidewalls. Crystallinity with peripheral region 120 is substantially the same as within core 122 with the exception that defect density is significantly lower as a result of such defects being limited to glide planes parallel to c-axis and lateral growth along n-axis then resulting in higher crystalline quality. Hence, equivalent or lower defect density GaN films are provided on tall/deep silicon mesa structures without using complex buffer engineering typical for blanket wafer growths of III-N-on-silicon. In one embodiment, threading dislocation density within peripheral region 120 is at least an order of magnitude lower than threading dislocation density within core region 122. In one such embodiment, defect density is no more than 1e9 cm$^{-2}$. Although not depicted, III-N material may also be disposed over regions of substrate 105 surrounding mesa 106. This III-N material is of poor quality, not having the advantage of seeding from mesa 106, but will not extend up the entire sidewall of mesa 106.

One or more III-N epitaxial semiconductor device layer 150 is disposed over the III-N epitaxial islands 115. III-N epitaxial semiconductor device layer 150 covers at least the (0001) and (000-1) surfaces of peripheral region 120. In the exemplary embodiment illustrated in FIG. 1A, III-N epitaxial semiconductor device layer 150 is further disposed over the n-plane sidewalls. III-N epitaxial semiconductor device layer 150 includes one or more material layer of composition distinct from the composition of III-N islands 115. In one exemplary embodiment where III-N island 115 is GaN, III-N epitaxial semiconductor device layer 150 includes one or more polarization layer having a composition that induces a 2D electron gas (2DEG) 135 in a first channel region of peripheral region 120. For a GaN epitaxial island 115, non-limiting examples of polarization layer materials include one or more of AlN, AlInN, or AlGaN. Exemplary thicknesses of a polarization layer(s) range from 20-100 nm. In other embodiments, III-N epitaxial semiconductor device layer 150 includes a multi-layered heteroepitaxial stack, such as but not limited to any quantum well stack suitable for LED devices.

Figure 1B:
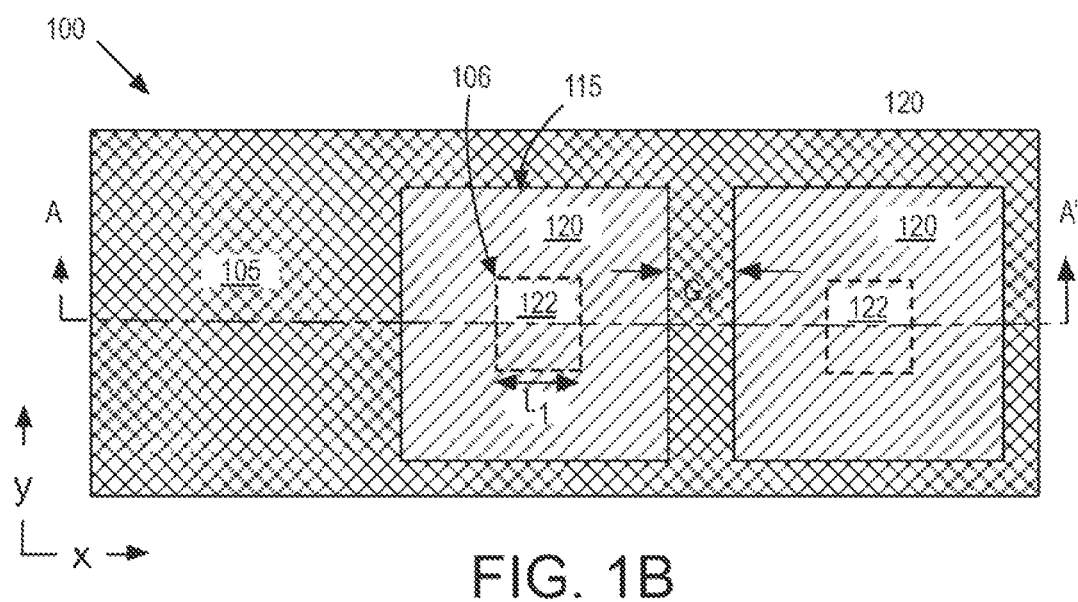
FIG. 1B is a plan view of the semiconductor heterostructure illustrated in FIG. 1A, in accordance with a further embodiment.
Figure 2A:
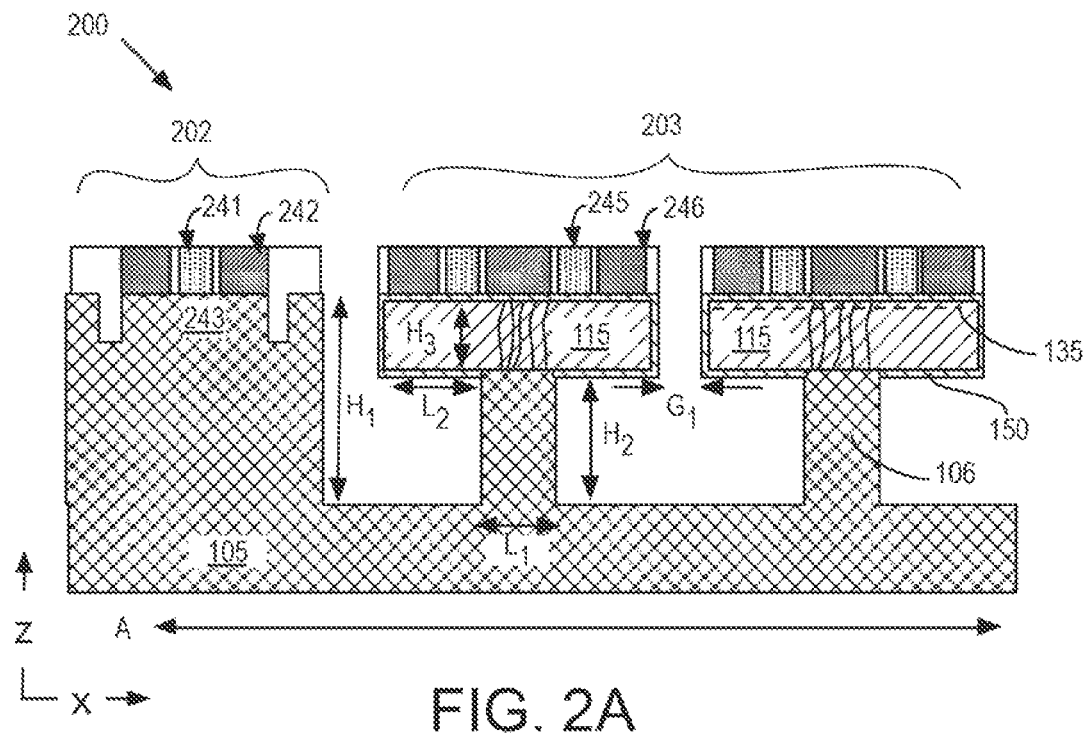
FIG. 2A is a cross-sectional view of an SoC including a silicon-based transistor and a III-N-based transistor incorporating the semiconductor heterostructure illustrated in FIG. 1A, in accordance with a further embodiment.
Figure 2B:
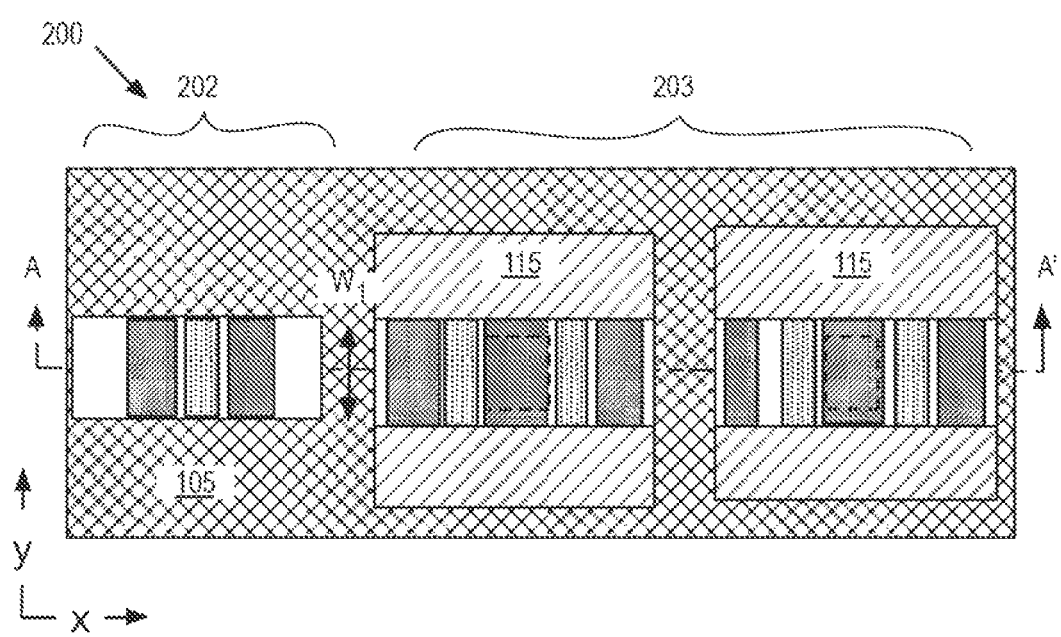
FIG. 2B is a plan view of the SoC illustrated in FIG. 2A, in accordance with a further embodiment.

FIG. 1B is a plan view further illustrating semiconductor heterostructure 100, in accordance with a further embodiment. As shown in FIG. 1B, mesas 106 are pillars of a nominal width $L_1$ and with III-N epitaxial islands 115 including periphery region 120 surrounding core region 122. In embodiments, a III-N semiconductor device includes semiconductor heterostructure 100. The device further includes one or more device terminal coupled to the one or more semiconductor device layers within the peripheral region 120. The III-N semiconductor device occupying substrate region 103 may further be integrated with a silicon based transistor within substrate region 102 to form a SoC. FIG. 2A is a cross-sectional view of an exemplary SoC 200 including a silicon-based transistor 202 and III-N-based transistors 203 incorporating the semiconductor heterostructure 100 (FIG. 1A), in accordance with an embodiment. FIG. 2B is a plan view of SoC 200, in accordance with a further embodiment.

As shown in FIG. 2A, silicon-based transistor 202 includes a gate electrode 241 forming part of a gate stack disposed over a non-planar semiconductor body 243 including a channel region. Gate electrode 241 is to modulate conduction between source/drain terminals 242 disposed on opposite sides of gate electrode 241. In the exemplary embodiment, silicon-based transistor 202 is a non-planar MOSFET, but silicon-based transistor 202 may employ any known silicon-based transistor technology as embodiments are not limited in this respect. Each III-N transistor 203 is a heterojunction FET (HFET) including at least a gate electrode 245 disposed over peripheral region 120. Gate electrode 245 is to modulate the 2DEG 135. In the exemplary embodiment where mesa height $H_2$ is set to accommodate III-N island height $H_3$ within the recess height $H_1$, gate electrode 245 is substantially planar with gate electrode 241.

III-N transistors 203 advantageously further include at least one of a pair of source/drain terminals 246 also disposed over peripheral region 120. Depending on lateral dimensions of III-N island 115 (e.g., $L_2$) and lateral dimensions of III-N transistor terminals, three terminals of III-N transistor 203 (e.g., two source/drain terminals 246, and gate electrode 245) may all be disposed over peripheral region 120. In the exemplary embodiment illustrated in FIG. 2A however, one source/drain terminal is at least partially disposed over core region 122 as high defect density within the core may be of little consequence to transistor performance if contained with a source/drain region. As further illustrated in FIGS. 2A and 2B, two III-N transistors electrically sharing a source/drain are formed over each III-N semiconductor island 115 with transistors 203 having a current carrying width $W_1$.

Figure 3:
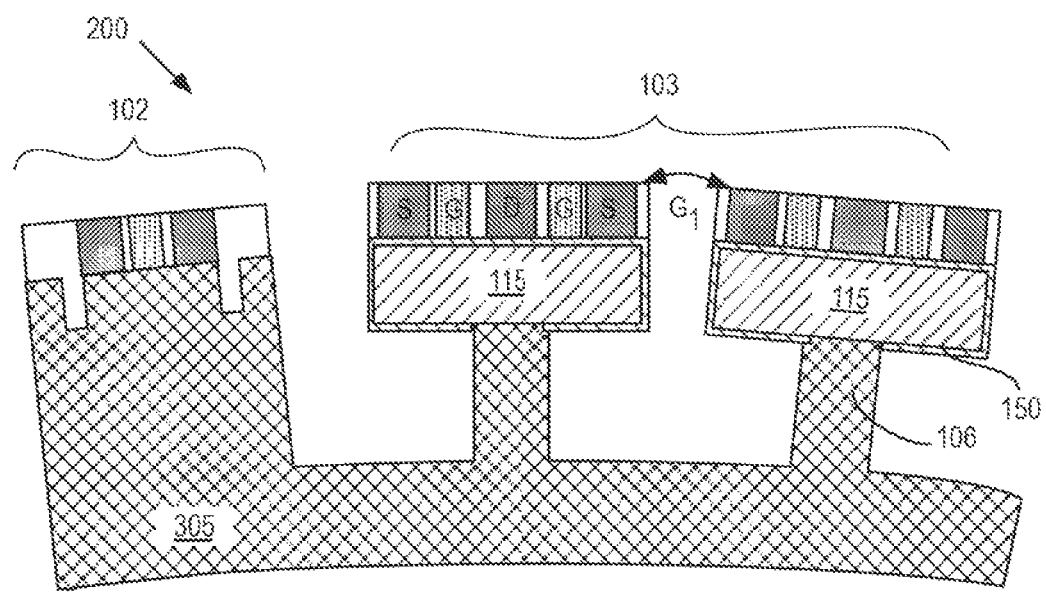
FIG. 3 is a cross-sectional view of the SoC illustrated in FIG. 2A further illustrating strain in a thinned substrate, in accordance with embodiments.

In embodiments, III-N-based transistors disposed on separate silicon mesas are physically connected together by a thin silicon substrate. Although III-N-based transistors on a contiguous III-N film (e.g., GaN) are prohibitively brittle due to strong ionic bonding, the SoC 200 illustrated in FIG. 2A is made compliant by the gap space $G_1$ between nearest neighboring III-N islands 115. FIG. 3 is a cross-sectional view of the SoC 200 further illustrating elastic strain in a thin substrate 305, in accordance with embodiments. For the exemplary embodiment where thin substrate 305 is silicon, substrate 305 has a z-thicknesses of 50 μm, or less, and advantageously no more than 25 μm. While such a low silicon substrate thickness would likely cause a contiguous III-N film to fracture, mesas 106 are free to accommodate flexure of substrate 305 through gap spacing $G_1$ without inducing stress/strain on III-N islands 115. SoC 200 is therefore suitable for 3DIC integration (e.g., stacking) and/or incorporation into bendable IC platforms. In various thin substrate embodiments, adjacent silicon mesas 106 may be backfilled with a flowable dielectric (e.g., flowable oxide or polymer), or surrounded with free space (e.g., disposed within a void occluded by a backend capping layer).

Figure 4A:
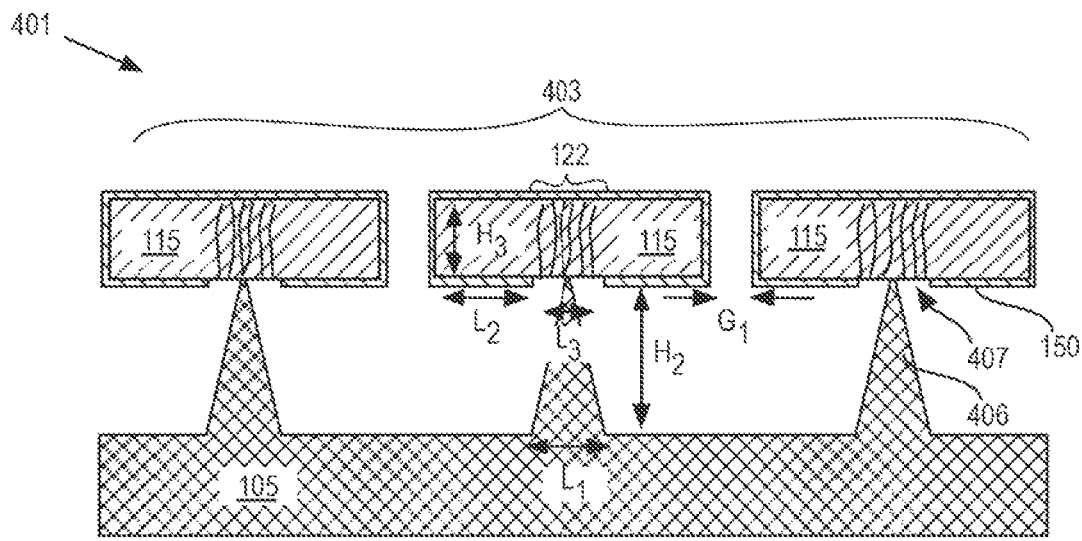
FIG. 4A is a cross-sectional view of a semiconductor heterostructure including III-N semiconductor islands disposed on top surfaces of undercut silicon mesas, in accordance with embodiments.

The III-N semiconductor heterostructures, and semiconductor devices incorporating such heterostructures, described above are also well suited to many of the substrate/film transfer techniques known in the art as the silicon mesas may be readily undercut selectively to the overlying III-N semiconductor islands. FIG. 4A is a cross-sectional view of a semiconductor heterostructure 401 including a plurality of III-N semiconductor islands 403 disposed on top surfaces of undercut silicon mesas 406, in accordance with embodiments. As shown, silicon mesas 406 are all undercut to have a lateral width $L_3$ proximal to the III-N island that is smaller than the lateral width of the III-N island core 122, which in the exemplary embodiment is substantially equal to $L_1$. Depending on the crystal orientation of substrate 105 and the undercut technique (e.g., by wet chemical etch), a base of mesa 406 may also be undercut, or remain substantially unetched (i.e., still having lateral width of $L_1$). For example, for a (100) silicon substrate 405, a crystallographic etchant may provide undercut mesa 406 with sloped sidewalls aligned to (111) crystal planes. Another structural feature of an undercut mesa is the presence of III-N island undercut portion 407 that is substantially free of at least one of the one or more III-N semiconductor device layer 150.

Figure 4B:
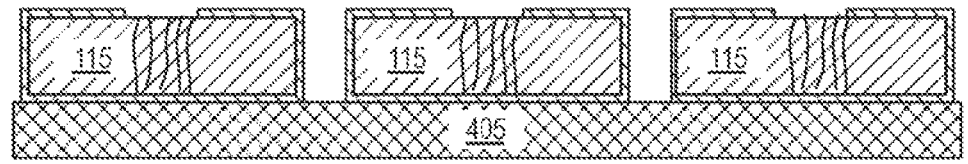
FIG. 4B is a cross-sectional view of a semiconductor heterostructure including a plurality of III-N semiconductor islands disposed on a transfer substrate, in accordance with embodiments.

FIG. 4B is a cross-sectional view of a semiconductor heterostructure 402 including a plurality of III-N semiconductor islands 115 disposed on a transfer substrate 405, in accordance with embodiments. Transfer substrate 405 may be any carrier known in the art to be suitable for the chosen transfer technique, such as but not limited to glass, oxide-on-silicon (SOI), or flexible substrates like PET and polyimide. Semiconductor heterostructure 402 may be fabricated by transferring III-N semiconductor islands 115 from the silicon mesas they were grown to the transfer substrate 405 using any known thin film transfer technique. In one exemplary embodiment, the III-N semiconductor islands 115 are transferred from undercut silicon mesas 406 (FIG. 4A). Any bonding technique may be used to join top exposed surfaces of III-N semiconductor islands 115 to transfer substrate 405 (e.g., a dielectric bond layer may be disposed over III-N semiconductor device layer 150). For the exemplary transferred III-N semiconductor embodiment depicted in FIG. 4B, the (0001) surface of the III-N semiconductor islands 115 is proximal to transfer substrate 405 and the (000-1) surface of the islands is distal from transfer substrate 405.

Figure 4C:
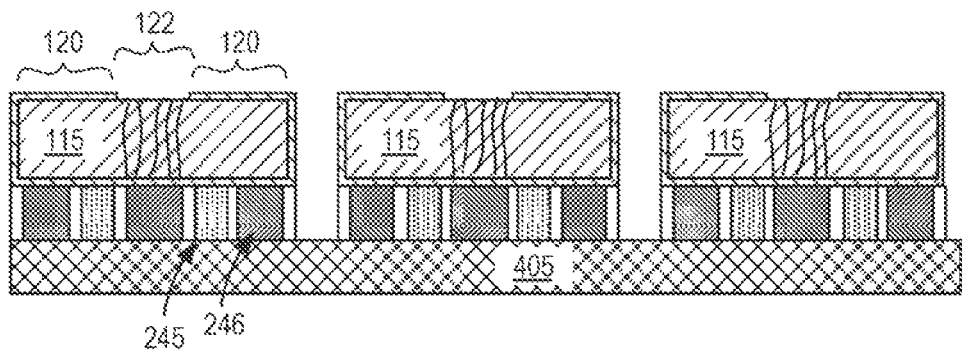
FIG. 4C is a cross-section view of a semiconductor heterostructure device disposed on a transfer substrate, in accordance with embodiments.

While FIGS. 4A and 4B illustrate a transferred III-N semiconductor heterostructure, III-N semiconductor heterostructures may also be transferred after a semiconductor device is fabricated on the III-N semiconductor islands while still attached to the silicon mesas. For such embodiments, device terminals coupled to a III-N semiconductor island may be sandwiched between the transfer substrate and the III-N semiconductor islands. FIG. 4C is a cross-sectional view of a semiconductor device 403 including III-N semiconductor-based transistors disposed on transfer substrate 405, in accordance with one such embodiment. As shown, gate electrode 245 and source/drain terminals 246 coupled to III-N semiconductor island 115 are sandwiched between transfer substrate 405 and the (0001) surface of the III-N semiconductor islands 115. The (000-1) surface of III-N semiconductor islands 115 is then exposed for further processing, such as but not limited to additional III-N semiconductor material layer deposition, and/or formation of additional device electrical terminals, and/or 3DIC processing.

Figure 5:
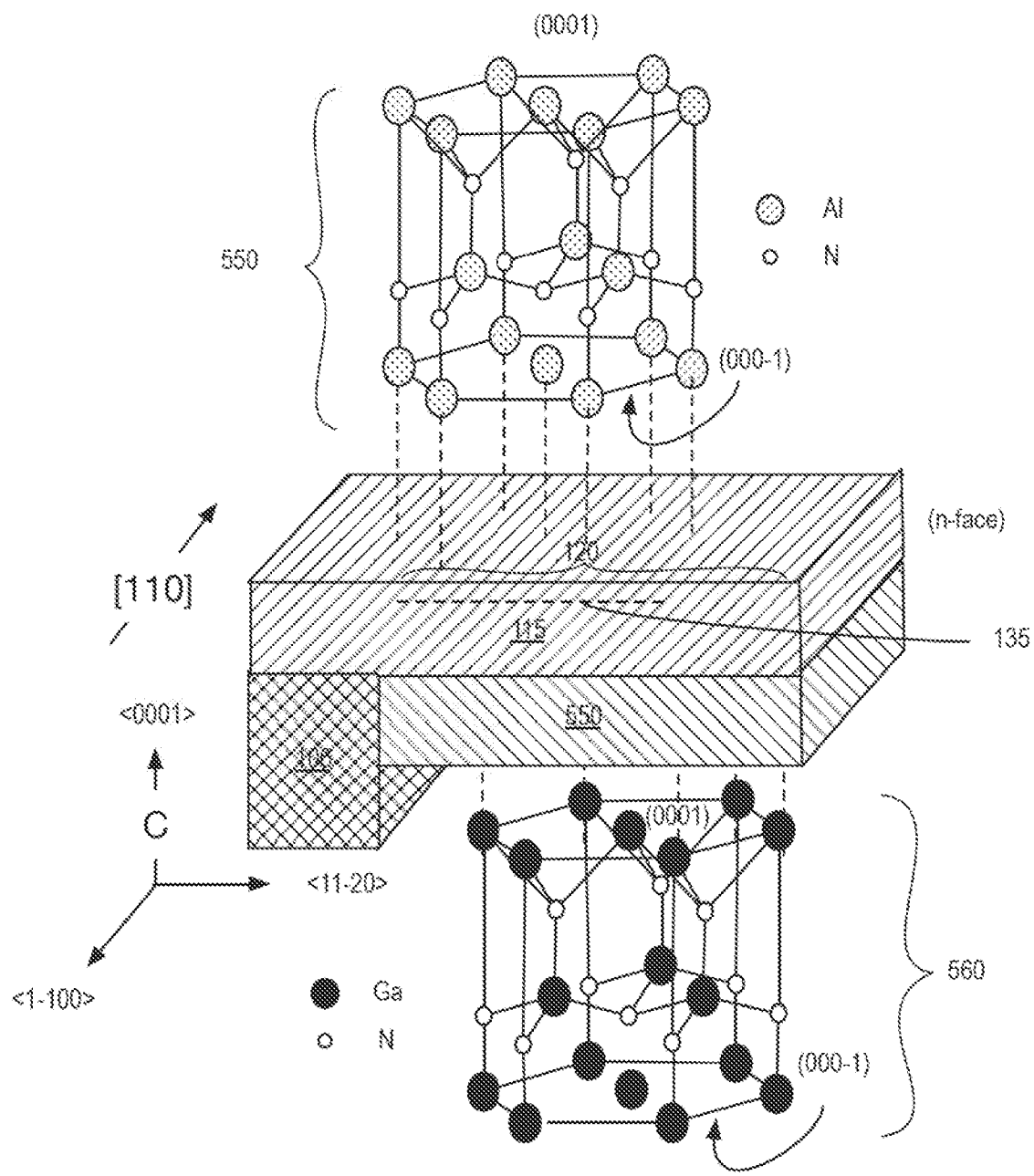
FIG. 5 is an isometric view of III-N semiconductor layers disposed on multiple polar surfaces of an overgrown periphery of a III-N semiconductor island, in accordance with embodiments.
Figure 6A:
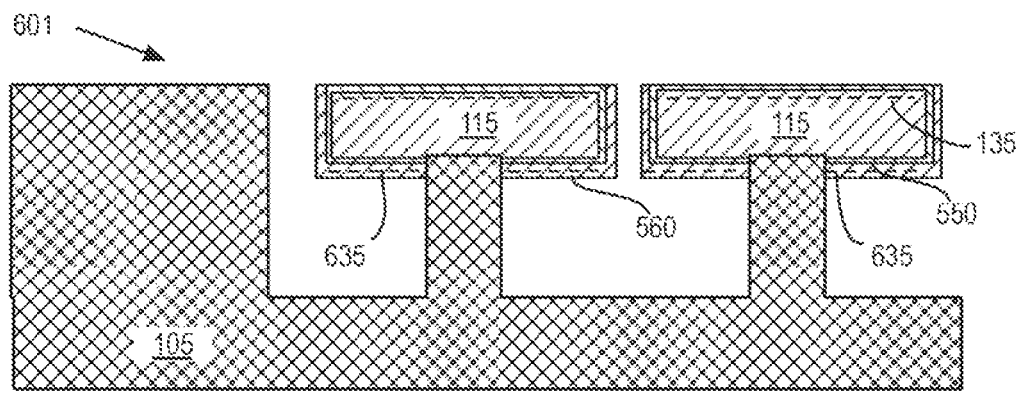
FIG. 6A is a cross-sectional view of a III-N semiconductor heterostructure including a polarization layer and a second III-N device layer disposed on the polarization layer, in accordance with embodiments.

In an embodiment, a III-N semiconductor heterostructure includes a 2DEG on opposing polar surfaces of a III-N epitaxial island disposed on a silicon mesa. FIG. 5 is an isometric view of III-N semiconductor device layers disposed on both (0001) and (000-1) polar surfaces of a laterally overgrown periphery of a III-N semiconductor island, in accordance with embodiments. As illustrated for an exemplary (100) silicon mesa extending into the page along the [110] direction, an epitaxial III-N (e.g., GaN) semiconductor island 115 has the c-axis orthogonal to a top of the island 115. Because of the lateral overgrowth, both (0001) and (000-1) surfaces are exposed within the peripheral region 120. FIG. 5 further illustrates a unit cell of a device layer stack including AlN polarization layer 550 grown on the (0001) surface of semiconductor island 115 leading to the 2DEG 135 within peripheral region 120. Also illustrated is a unit cell of a second III-N semiconductor device layer 560 that is subsequently grown over polarization layer 550 on the exposed (000-1) surface of semiconductor island 115. FIG. 6A is a cross-sectional view of a III-N semiconductor heterostructure 601 with multiple device layers including a polarization layer 550 that is disposed on a III-N epitaxial island 115, and a second III-N device layer 560 that is disposed on polarization layer 550. Advantageously, the second III-N semiconductor device layer 560 has a composition sufficiently distinct from the composition of the polarization layer 550 to maintain a second 2DEG 635 within second III-N semiconductor device layer 560. In one advantageous embodiment, a GaN semiconductor layer 560 is disposed over a III-N polarization layer 550 (e.g., AlN) disposed on a GaN island 115. As is clear from FIG. 6A, III-N semiconductor heterostructure 601 may be fabricated by performing an additional epitaxial growth over III-N semiconductor heterostructure 100 (FIG. 1). Masked growth techniques may be utilized to block excess device layer growth over the (0001) surfaces of device layer 150. For a higher effective transistor density (e.g., double drive current/transistor footprint), a multi-channel transistor may be fabricated with these multi-layered stacks providing a 2DEG on opposing polar surfaces of the peripheral region of a III-N epitaxial island.

Figure 6B:
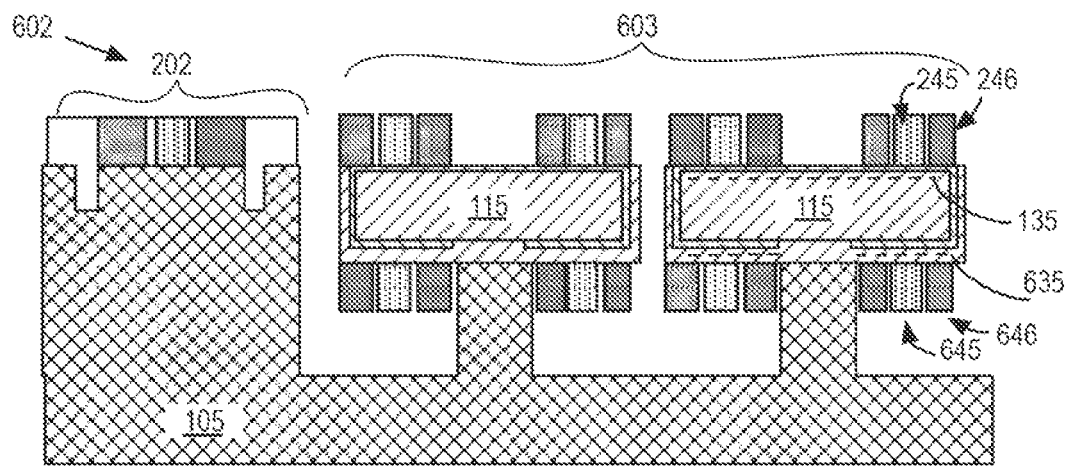
FIG. 6B is a cross-sectional view of a III-N semiconductor-based multi-channel transistor incorporating the III-N semiconductor heterostructure illustrated in FIG. 6A, in accordance with embodiments.

FIG. 6B is a cross-sectional view of a SoC 602 including silicon-based transistor 202 and III-N semiconductor-based multi-channel transistors 603 incorporating the III-N semiconductor heterostructure illustrated in FIG. 6A, in accordance with embodiments. As shown, gate electrode 245 along with a pair of source/drain terminals 246 on opposite sides of gate electrode 245 are operable as a first transistor based on modulation of 2DEG 135. In this embodiment, all three terminals are disposed within the peripheral region of III-N epitaxial island 115. Gate electrode 645 along with a pair of source/drain terminals 646 on opposite sides of gate electrode 645 are operable as a second transistor based on modulation of 2DEG 635. In this embodiment, all three terminals are disposed within the peripheral region of III-N epitaxial island 115. In a first embodiment, gate electrodes 245, 645 are coupled together and source/drain terminals 245, 246 are coupled together, for example using any gate-all-around and contact-all-around techniques known for nanowire transistors. In a second embodiment, gate electrode 245 is electrically independent of 246, and source/drain terminals 245 are electrically independent of source/drain terminals 646. For the second embodiment, gate electrode 645, and source/drain terminals 646 may wrap around an m-plane sidewall of III-N epitaxial island 115 for the sake of electrical interconnection. Metal patterning on the top surface of III-N epitaxial island 115 may provide isolation between gate electrodes 245, 645, as well as between source/drain terminals 246 and 646.

Figure 6C:
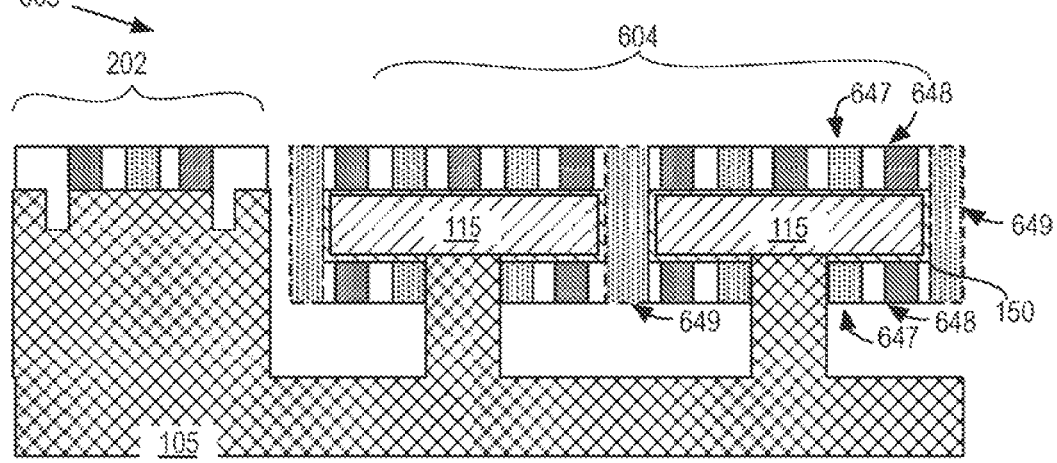
FIG. 6C is a cross-sectional view of a SoC including a silicon-based transistor and a III-N semiconductor-based LED, in accordance with embodiments.

Notably, the multi-polar surface architectures described above are not limited to HFET devices. For example, a similar architecture is also applicable for light emitted diode (LED) devices. LED architectures may also utilize different device layer stacks between surfaces of opposing polarity as illustrated in FIG. 6A-6B for HFET architectures. FIG. 6C is a cross-sectional view of a SoC 603 including silicon-based transistor 202 and a plurality of III-N semiconductor-based LEDs 604, in accordance with one embodiment. At least a first LED terminal is disposed on a (0001) surface and at least one other LED terminal is disposed a (000-1) polarity surface. In the exemplary embodiment, any nanowire metallization technique may be employed to form a plurality of n-type diode terminals 647 and a plurality of p-type diode terminals 648 over a III-N device layer 150 that is suitable for LEDs. The terminals wrap around peripheral regions of III-N semiconductor islands 115 to make contact with the (0001) and (000-1) surfaces for double-sided emission that may improve LED fill factor over that of a single-sided LED architecture. Emission characteristics may also differ between LEDs formed on opposing polar surfaces. In further embodiments, illustrated as optional by dashed line FIG. 6C, sidewall metallization 649 may also be disposed on an m-plane sidewall surface of III-N epitaxial islands 115.

Figure 7A:
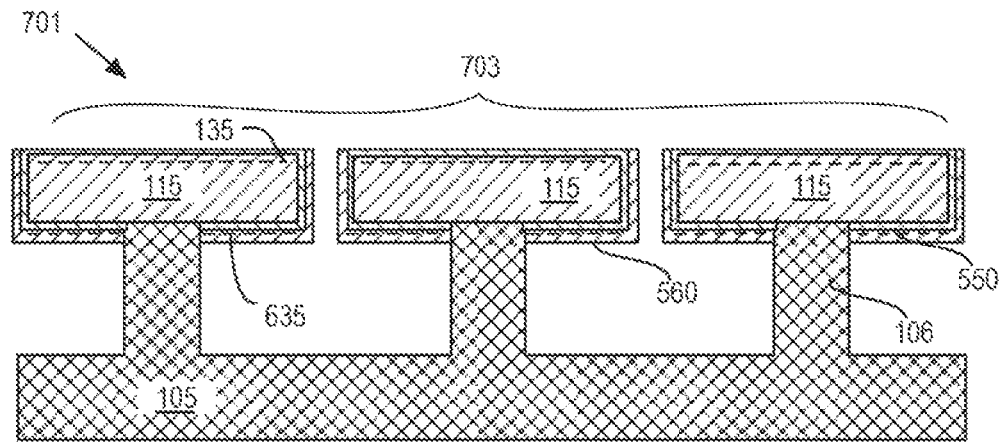
FIGS. 7A, 7B, and 7C are cross-sectional views of a transferred III-N semiconductor-based multi-channel transistor, in accordance with embodiments.
Figure 7B:
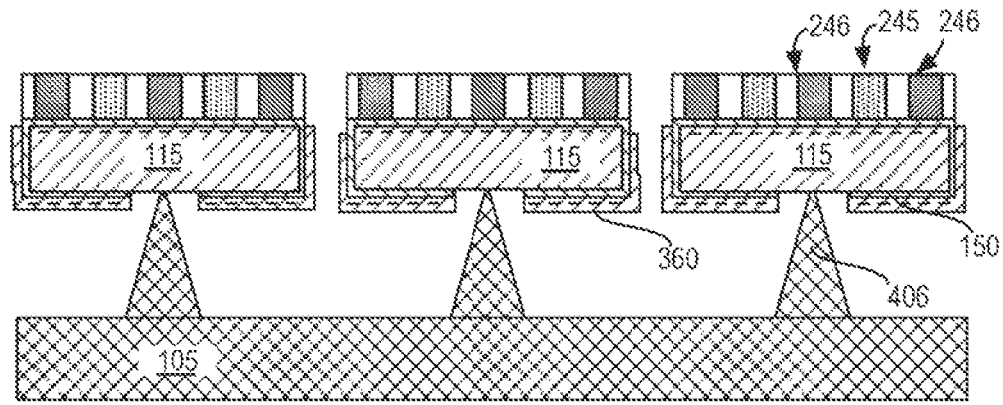
Figure 7C:
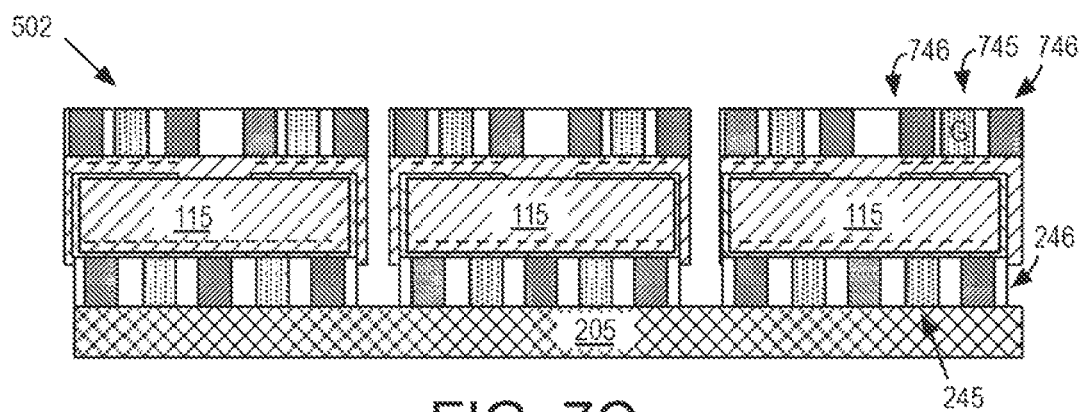

In alternate embodiments, a multi-channel transistor device utilizes a transferred III-N epitaxial island. For such embodiments, instead of the wrap-around nanowire device terminal metallization techniques utilized for the multi-channel transistor devices illustrated in FIG. 6A-6B, top-side device terminal metallization is utilized in conjunction with film transfer. FIGS. 7A, 7B, and 7C are cross-sectional views illustrating transferred III-N semiconductor-based multi-channel transistors, in accordance one exemplary embodiment. Referring to FIG. 7A, III-N heterostructure 701 includes a plurality of III-N epitaxial islands 115 having multiple device layers to provide a 2DEG on opposing polar surfaces of a III-N epitaxial island disposed on a silicon pillar. A III-N semiconductor polarization layer 550 is disposed on both (0001) and (000-1) polar surfaces of a laterally overgrown periphery of a III-N semiconductor island 115. A second III-N semiconductor device layer 560 is further disposed over polarization layer 550 proximal the (000-1) surface. As further illustrated in FIG. 7B, any known top-side metallization technique is utilized to form gate electrode 245 and a pair of source/drain terminals 246 on opposite sides of gate electrode 245. After the top side transistor terminals are formed, silicon mesas 106 are then undercut, for example with a wet etchant such as TMAH, to form undercut mesa 406. Any known film transfer process is then performed to transfer the transferred III-N epitaxial islands 115 to transfer substrate 205 as illustrated in FIG. 7C. Following film transfer, gate electrode 245 and source/drain terminals 246 are located/disposed between epitaxial island 115 and transfer substrate 205. Top-side metallization is repeated to form gate electrode 745 between source/drain terminals 746.

Figure 8A:
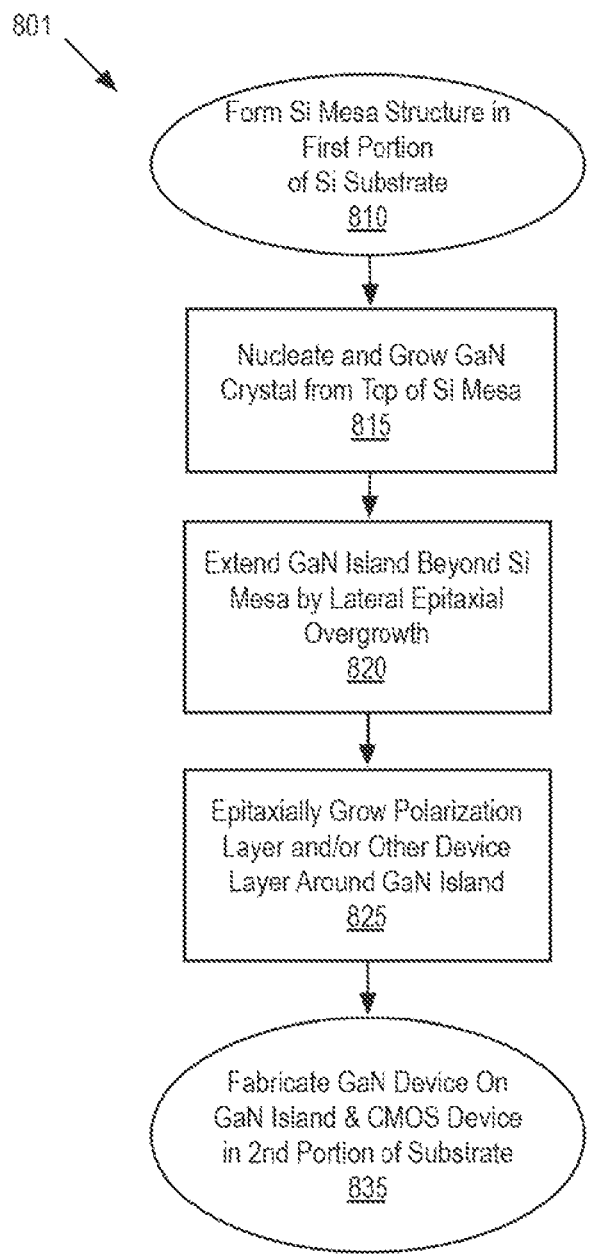
FIG. 8A is a flow diagram illustrating a method of forming a III-N semiconductor heterostructure including a pair of III-N semiconductor islands from top surfaces of a pair of silicon mesas, in accordance with embodiments.
Figure 9A:
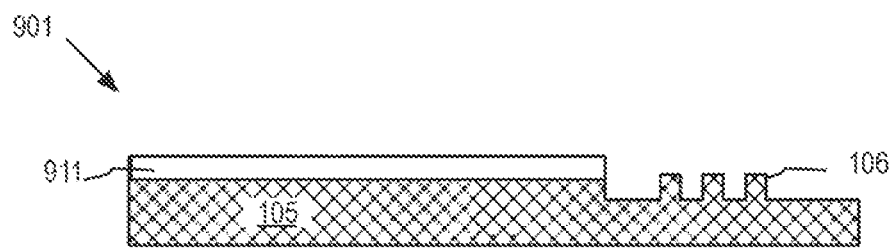
FIGS. 9A, 9B, and 9C are cross-sectional views of an SoC evolving as selected operations in an exemplary method are performed, in accordance with embodiments.
Figure 9B:
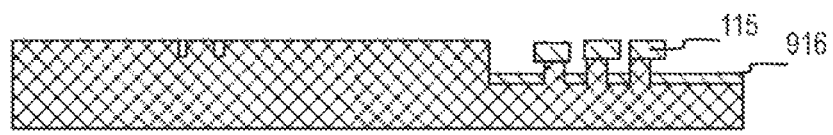
Figure 9C:
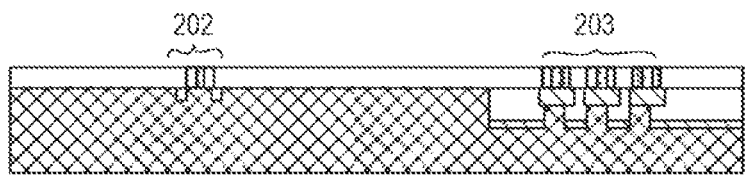

The exemplary III-N semiconductor heterostructures on III-N islands disposed on silicon mesas and devices using such heterostructures described in the context of FIG. 1A-7C may be fabricated using a variety of techniques. FIG. 8A is a flow diagram illustrating a method 801 of forming a III-N semiconductor heterostructure including a pair of III-N semiconductor islands from top surfaces of a pair of silicon mesas, in accordance with certain embodiments. FIGS. 9A, 9B, and 9C are cross-sectional views of an SoC evolving as selected operations in method 801 are performed, in accordance with an embodiment.

Referring to FIG. 8, method 801 begins at operation 810 where a pair of silicon mesas is formed in a first region of a silicon substrate. Deep silicon trenches are etched into a silicon substrate in pre-defined areas (e.g., where GaN transistors for high voltage SoC, PMIC, and RF-PA are to be located. In one embodiment, a Bosch-type etch with a $XeF_2$ chemistry is performed at operation 810. As further illustrated in FIG. 9A, a hard mask 911, such as Al or $Al_2O_3$, may be used to protect regions of substrate 105 during the deep silicon trench etch. The deep trenches formed at operation 810 advantageously have minimal sidewall flaring to limit subsequent III-N epitaxial growth on sidewalls of mesas 106. In exemplary embodiments, the trenches are etched to a depth of 500 nm-5 μm with greater depths needed for mesas of larger top surface area. In some embodiments, where a silicon based MOSFETs are to be fabricated in other regions of the substrate, the silicon mesas may be unmasked at etched back to reduce their z-height sufficiently accommodate a thickness of III-N material that will be subsequently grown.

Returning to FIG. 8, method 801 continues with III-N nucleation and epitaxial growth at operation 815. Epitaxial growth is performed in a chemical vapor deposition (CVD) or molecular beam epitaxy (MBE) chamber. In one exemplary embodiment, a thin (e.g., 20-200 nm) AlN nucleation layer is deposited directly on exposed silicon regions including at least the top silicon mesa surfaces. This nucleation layer can wrap around the sidewall of the silicon mesas. Following nucleation layer growth, a GaN layer is epitaxially grown using any known technique, growth temperature, pressure, and V/III ratio. At operation 820, lateral epitaxial overgrowth (LEO) of the GaN film is performed, which forms a peripheral region around the GaN grown at operation 815. In the embodiment further illustrated in FIG. 9B, an overhanging (GaN) epitaxial island 115 is grown to a film thickness of 300 nm-1.3 um. The amount of lateral overgrowth foe a desired gap spacing between m-plane sidewalls of adjacent islands can be tuned by process conditions to achieve a desired ratio of lateral growth rate:vertical growth rate (e.g., 1.5-2.0). If the substrate is not masked, a layer of GaN 916 will also form at the base of silicon mesa 106. GaN 916 will be of poorer quality than epitaxial island 115, and will not extend up the entire sidewall of silicon mesa 106 if the mesa has little flaring.

Returning to FIG. 8, method 801 continues with operation 825 where a polarization layer and/or an alternate device layer are epitaxially grown around the GaN island. In one exemplary embodiment, at least one of an AlGaN and/or AlN and/or AlInN layer 3-30 nm thick is grown around the overhanging GaN. On the c-plane (0001) surface, a 2DEG of high charge density and mobility in GaN is thereby induced. Once the GaN films with the polarization layer have been grown atop the silicon mesas, device fabrication can proceed at operation 835 to complete method 801. In the exemplary embodiment illustrated in FIG. 9C, III-N based transistors (e.g., HFETs) 203 can be formed on the top (0001) surface of the polarization layer using any known techniques. Silicon-based transistors (e.g., MOSFETs) 202 can be fabricated in other regions of substrate 105, again using any known techniques.

Figure 8B:
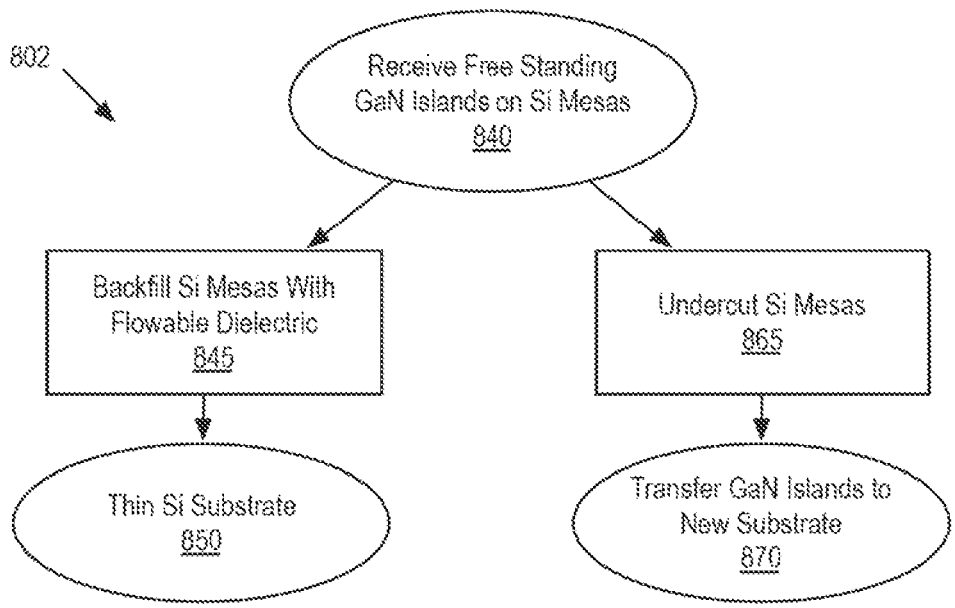
FIG. 8B is a flow diagram illustrating a method of forming flexible and transferred III-N semiconductor heterostructure devices, in accordance with embodiments.

Method 801 may be modified and/or supplemented with additional operations to fabricate flexible and transferred III-N semiconductor heterostructure devices. FIG. 8B is a flow diagram illustrating a method 802 of forming flexible and transferred III-N semiconductor heterostructure devices, in accordance with embodiments. Method 802 begins with receiving GaN islands freestanding on silicon mesas at operation 840. Such GaN epitaxial islands may be formed for example by performing operations 810-825 (FIG. 8A). In a flexible SoC embodiment, method 802 continues at operation 845 where a flowable dielectric is deposited around the silicon mesas. A flowable oxide, polyimide, etc. may be deposited with a spin-on process for example. The silicon substrate is then thinned at operation 850, with any wafer grinding or thinning process, to a thickness less than 50 μm, and advantageously less than 25 μm. Method 802 then returns to operation 835 in method 801 to complete fabrication of GaN devices on the GaN islands and CMOS devices in a second region of the silicon substrate. In a transferred GaN island embodiment, method 802 continues at operation 865 where silicon mesas are undercut at operation 865. A wet etchant, such as TMAH, may be used to etch the silicon mesas selectively to the GaN epitaxial islands by a predetermined amount. The GaN islands are then transferred to a transfer substrate at operation 870 using any thin film transfer process. In one exemplary embodiment, the III-N semiconductor islands are bonded with the (0001) surface facing the transfer substrate.

Figure 8C:
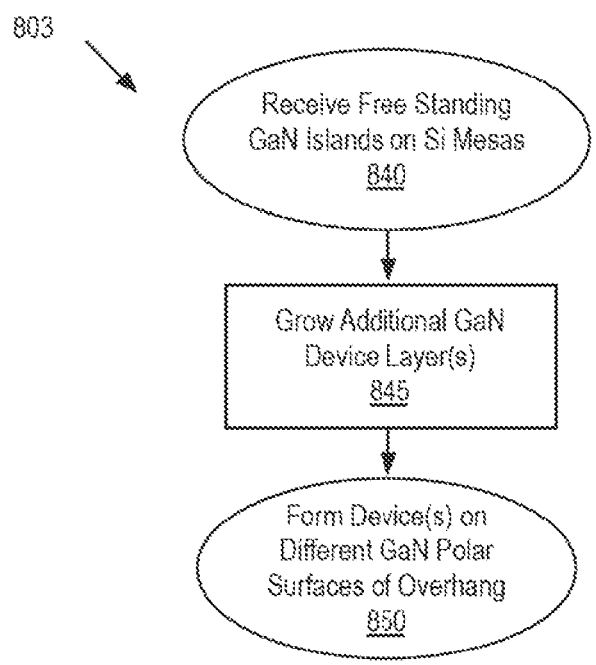
FIG. 8C is a flow diagram illustrating a method of forming a III-N semiconductor-based multi-channel device, in accordance with embodiments.

FIG. 8C is a flow diagram illustrating a method 803 of forming a III-N semiconductor-based multi-channel device, in accordance with embodiments. Method 803 begins with receiving GaN islands freestanding on silicon mesas at operation 840. Such GaN epitaxial islands may be formed for example by performing operations 810-825 (FIG. 8A). At operations 845, an additional III-N device layer is grown on a least one polar surface of a GaN epitaxial island. In an exemplary embodiment, a second GaN device layer is grown at operation 845 directly on a (000–1) surface of a polarization layer on the GaN epitaxial island using any epitaxial growth process. In further embodiments, a dielectric mask is deposited over a (0001) surface of the polarization layer prior to growing the second GaN device layer. Method 803 completes with forming devices on multiple polar surfaces of the GaN epitaxial island at operation 850. In an exemplary embodiment, operation 845 entails forming at least a first device terminal coupled to the one or more III-N semiconductor device layer grown from a (0001) surface of the GaN epitaxial island, and forming at least a second device terminal coupled to the one or more III-N semiconductor device layer grown from the (000–1) surface of the GaN epitaxial island. In a further embodiment, forming the one or more device terminal at operation 850 further comprises forming a gate electrode and at least one source/drain terminal coupled to a polarization layer.

Figure 10:
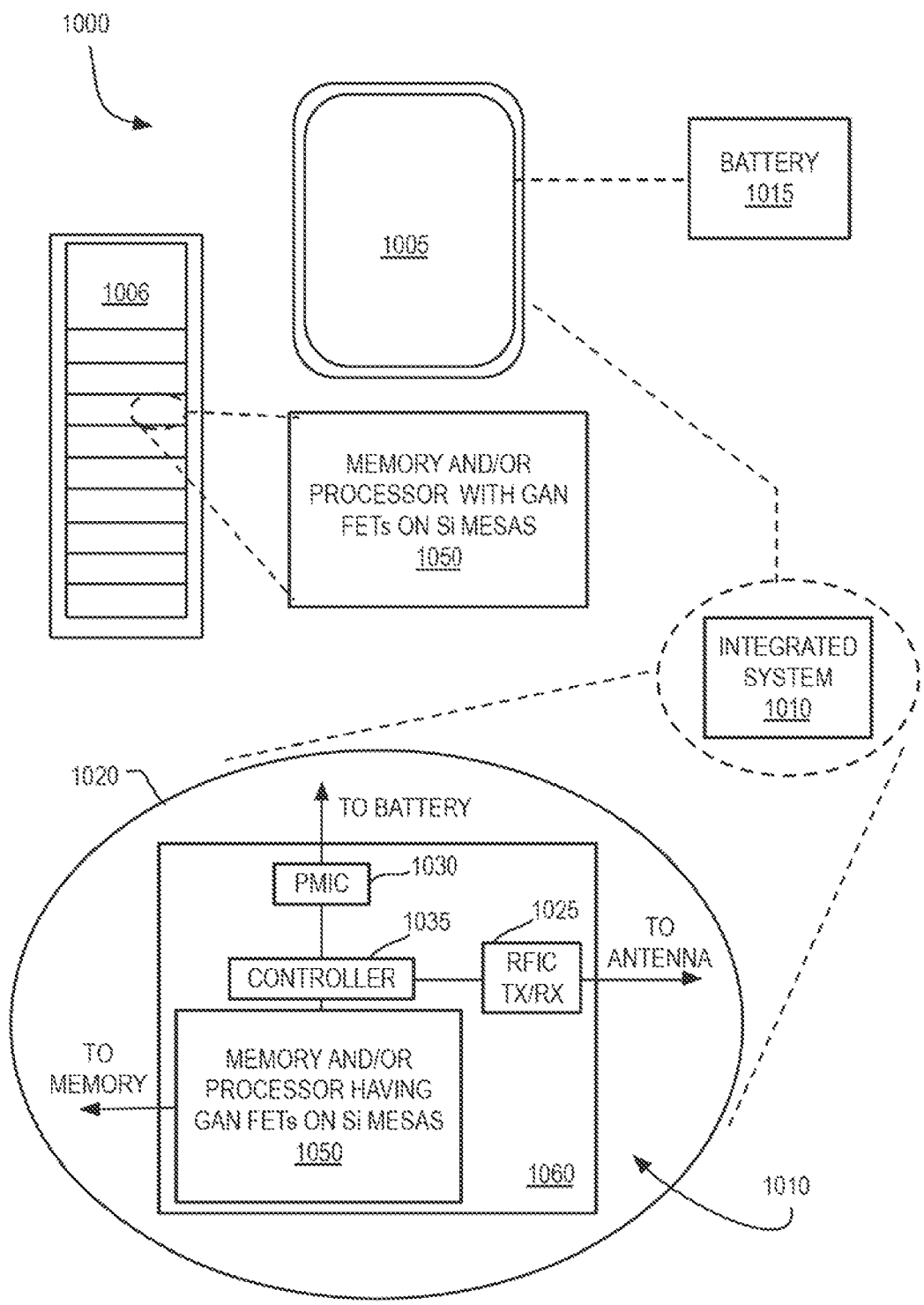
FIG. 10 illustrates a mobile computing platform and a data server machine employing an SoC including silicon MOSFETs and GaN HFETs on silicon mesas, in accordance with embodiments of the present invention.

FIG. 10 illustrates a system 1000 in which a mobile computing platform 1005 and/or a data server machine 1006 employs an IC including at least one III-N HFET disposed on a III-N epitaxial island overhanging a silicon mesa, in accordance with embodiments of the present invention. In further embodiments, the IC includes the III-N HFET disposed on the III-N epitaxial island overhanging the silicon mesa and further includes a silicon-based MOSFET monolithically integrated with the III-N HFET. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) including at least one III-N HFET disposed on a III-N epitaxial island overhanging a silicon mesa, for example as describe elsewhere herein. In further embodiments, the IC includes the III-N HFET disposed on the III-N epitaxial island overhanging the silicon mesa and further includes a silicon-based MOSFET monolithically integrated with the III-N HFET. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 11:
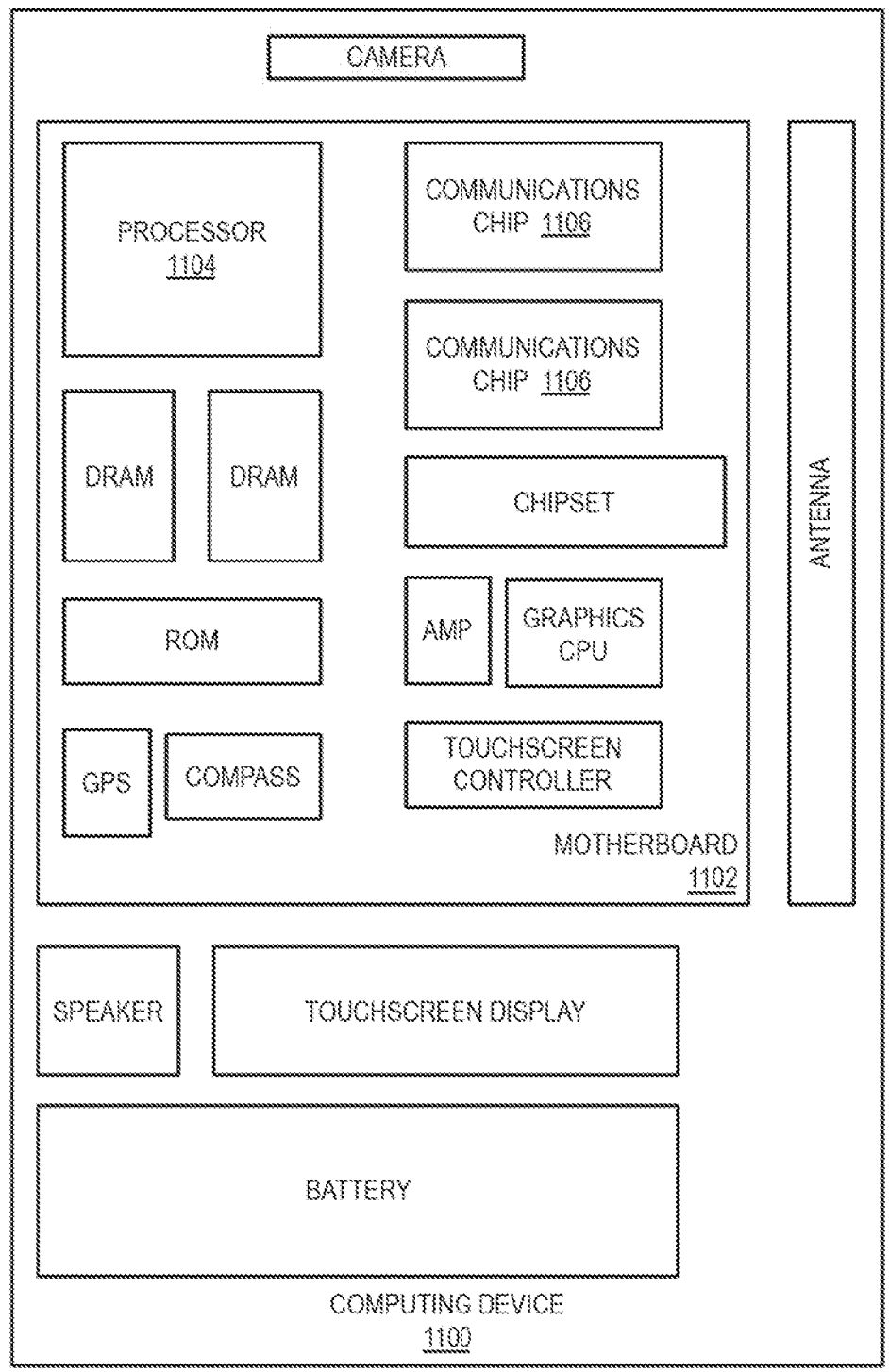
FIG. 11 is a functional block diagram of an electronic computing device, in accordance with an embodiment of the present invention.

FIG. 11 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate at least one III-N HFET disposed on a III-N epitaxial island overhanging a silicon mesa, in accordance with embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a semiconductor heterostructure includes a pair of silicon mesas disposed in a first region of a silicon substrate. The heterostructure includes a pair of III-N epitaxial islands disposed on top surfaces of the mesas with the c-axis of the islands substantially orthogonal to the top mesa surfaces, each island including a core region, and a peripheral region surrounding the core and extending laterally beyond sidewalls of the silicon mesa, the peripheral region having n-plane sidewalls separated by a non-zero spacing. The heterostructure includes one or more III-N epitaxial semiconductor device layer disposed over the III-N epitaxial islands, covering at least the (0001) and (000−1) surfaces of the peripheral region.

In furtherance of the first embodiments, the mesas extend from the substrate by a z-height that is at least 500 nm. The III-N epitaxial islands have a greatest z-thickness over the mesa top surface that is no more than 500 nm. The peripheral regions extend laterally beyond the sidewalls by at least 500 nm. The one or more semiconductor device layer comprises a polarization layer having a composition that induces a 2D electron gas (2DEG) in a first channel region of the peripheral region.

In furtherance of the embodiment immediately above, the smallest lateral width of the mesa is between 500 nm and 1 µm. The mesas extend from the substrate by a z-height that is between 750 nm and 5 µm. The one or more semiconductor device layer includes a polarization layer having a composition sufficiently distinct from that of the III-N islands to induce a first 2D electron gas (2DEG) within the peripheral region. The one or more semiconductor device layer includes a second III-N semiconductor layer disposed over the polarization layer and having a composition sufficiently distinct from that of the polarization layer to maintain a second 2DEG within the second III-N semiconductor layer.

In furtherance of the first embodiments, the III-N island core has at least a first density of threading dislocations extending from the top mesa surface through a z-height of the islands, and wherein the peripheral region has a threading dislocation density that is at least an order of magnitude lower than the first density.

In furtherance of the first embodiments, the one or more epitaxial semiconductor device layer is further disposed on the m-plane sidewalls of the III-N islands.

In furtherance of the first embodiments, the silicon mesas are undercut to have a lateral width proximal to the III-N island that is smaller than that of the III-N island core, an undercut portion of the III-N island substantially free of the one or more III-N semiconductor device layers.

In furtherance of the first embodiments, the smallest lateral width of the mesa is between 500 nm and 5 µm. The mesas extend from the substrate by a z-height that is between 750 nm and 5 µm. The peripheral regions extend laterally beyond the sidewalls by at least 500 nm. The substrate includes a second region adjacent to the first region, the second substrate region having a substantially planar top surface at a z-height relative to a bottom of the mesas that is greater than the z-height of the mesas. The III-N island comprises GaN with the c-plane no more than 10° from parallel to a (100) plane of the substrate. The one or more semiconductor device layer comprises a polarization layer having a composition sufficiently distinct from GaN to induce a first 2D electron gas (2DEG) within the GaN peripheral region. The one or more epitaxial semiconductor device layer is further disposed on the n-plane sidewalls of the III-N islands.

In one or more second embodiments, a semiconductor heterostructure includes a pair of III-N epitaxial islands disposed on a transfer substrate with the (0001) surface of the islands proximal to the transfer substrate and the (000−1) surface of the islands distal from the transfer substrate. Each island including a core region and a peripheral region surrounding the core, the pair of islands having n-plane sidewalls separated by a non-zero spacing. The III-N island cores have at least a first density of threading dislocations extending from the top mesa surface through a z-height of the islands, and wherein the peripheral region has a threading dislocation density that is at least an order of magnitude lower than the first density. One or more III-N epitaxial semiconductor device layer disposed over the III-N epitaxial islands, covering at least the (0001) and (000−1) surfaces of the peripheral region.

In furtherance of the second embodiments, the one or more III-N epitaxial semiconductor device layer is disposed between the transfer substrate and both the III-N epitaxial island core and peripheral regions. The (000−1) surface of the core region is substantially free of the at least one of the one or more III-N epitaxial semiconductor device layer covering the (000−1) surface of the peripheral region.

In one or more third embodiments, a semiconductor device includes a semiconductor heterostructure that further includes a pair of silicon mesas disposed in a first region of a silicon substrate. The heterostructure further includes a pair of III-N epitaxial islands disposed on top surfaces of the mesas with the c-axis of the islands substantially orthogonal to the top mesa surfaces, each island including a core region and an peripheral region extending lateral from the core and beyond sidewalls of the silicon mesa, and the peripheral regions having n-plane sidewalls separated by a non-zero spacing. The heterostructure further includes one or more III-N epitaxial semiconductor device layer disposed over the III-N epitaxial islands, covering at least the (0001) and (000−1) surfaces of the peripheral region. The semiconductor device further includes one or more device terminal coupled to the one or more semiconductor device layers within the peripheral region.

In furtherance of the third embodiments, the polarization layer has a composition that induces a 2D electron gas (2DEG) in a first channel region of the peripheral region. The one or more device terminal further comprises a gate terminal disposed between a pair of source/drain terminals, and at least the gate terminal is disposed within the peripheral region and operable to modulate the 2DEG.

In furtherance of the embodiment immediately above, the one or more III-N epitaxial semiconductor device layer includes the polarization layer disposed over a (0001) surface of the III-N island. The device layer further includes a second III-N semiconductor device layer disposed over a (000−1) surface of the polarization layer and having a composition sufficiently distinct from that of the polarization layer to maintain a second 2DEG within the second III-N semiconductor device layer. The one or more device terminal further comprises a second gate terminal disposed between a second pair of source/drain terminals, at least the second gate terminal disposed within the peripheral region and operable to modulate the second 2DEG.

In furtherance of the third embodiments, the one or more III-N epitaxial semiconductor device layer further includes a light emitting diode (LED) stack disposed over the III-N epitaxial islands, covering at least the (0001) and (000−1) surface of the peripheral region. The one or more device terminal includes a first terminal disposed on at least the (0001) surface of the device layer, and a second terminal disposed on at least the (000−1) surface of the device layer.

In one or more fourth embodiments, a method of forming a semiconductor heterostructure includes forming a pair of silicon mesas in a first region of a silicon substrate. The method further includes epitaxially growing a core region of a III-N semiconductor island with the c-axis of the islands substantially orthogonal from a top surface of each of the silicon mesas. The method further includes forming a peripheral region of the III-N semiconductor island surrounding the core region by performing a lateral epitaxial overgrowth (LEO) process until n-plane sidewalls of the islands are spaced apart by a predetermined gap. The method further includes epitaxially growing one or more III-N semiconductor device layer from at least the (0001) and (000−1) surfaces of the peripheral regions of the pair of III-N semiconductor islands.

In furtherance of the embodiment immediately above, growing the one or more III-N semiconductor device layer further includes growing a polarization layer having a composition sufficiently distinct from that of the III-N islands to induce a first 2D electron gas (2DEG) within the peripheral region of the III-N islands.

In furtherance of the embodiment immediately above, growing the one or more III-N semiconductor device layer further comprises growing a second III-N semiconductor layer disposed over at least a (000−1) surface of the polarization layer and having a composition sufficiently distinct from that of the polarization layer to maintain a second 2DEG within the second III-N semiconductor layer.

In furtherance of the fourth embodiments, the method further includes undercutting a portion of the silicon mesas to have a lateral width proximal to the III-N island that is smaller than that of the III-N island core region. The method further includes transferring the III-N semiconductor islands from the silicon mesas to a transfer substrate by bonding III-N semiconductor islands with the (0001) surface facing the transfer substrate.

In furtherance of the fourth embodiments, forming a pair of silicon mesas further comprises etching the substrate to form mesas extending from the substrate by a z-height that is at least 500 nm. Epitaxially growing a core region further comprises growing GaN to a greatest z-thickness over the mesa top surface that is no more than 500 nm. Epitaxially growing the peripheral regions further comprises growing GaN to at least 500 nm laterally beyond the mesa sidewalls.

In one or more fifth embodiment, a method of forming a semiconductor device includes forming a pair of silicon mesas in a silicon substrate. The method includes epitaxially growing a core region of a III-N semiconductor island with the c-axis of the islands substantially orthogonal from a top surface of each of the silicon mesas. The method includes forming a peripheral region of the III-N semiconductor island surrounding the core region by performing a lateral epitaxial overgrowth (LEO) process until n-plane sidewalls of the islands are spaced apart by a predetermined gap. The method includes epitaxially growing one or more III-N semiconductor device layer from at least the (0001) and (000–1) surfaces of the peripheral regions of the pair of III-N semiconductor islands. The method includes forming one or more device terminal coupled to the one or more semiconductor device layers within the peripheral region.

In furtherance of the fifth embodiments, forming the one or more device terminal further includes forming at least a first device terminal coupled to the one or more III-N semiconductor device layer grown from the (0001) surface. Forming at least a second device terminal coupled to the one or more III-N semiconductor device layer grown from the (000–1) surface.

In furtherance of the fifth embodiments, epitaxially growing one or more III-N semiconductor device layer further comprises growing a polarization layer from at least the (0001) surface of the III-N semiconductor island, the polarization layer having a composition that induces a 2D electron gas (2DEG) in a first channel region of the peripheral region. Forming the one or more device terminal further comprises forming a gate electrode and at least one source/drain terminal coupled to the polarization layer.

In furtherance of the fifth embodiments, epitaxially growing one or more III-N semiconductor device layer further includes growing a polarization layer from at least the (0001) surface of the III-N semiconductor island, the polarization layer having a composition that induces a 2D electron gas (2DEG) in a first channel region of the peripheral region. Epitaxially growing one or more III-N semiconductor device layer further includes growing a second III-N semiconductor device layer disposed over a (000–1) surface of the polarization layer, the second III-N semiconductor device layer having a composition sufficiently distinct from that of the polarization layer to maintain a second 2DEG within the second III-N semiconductor device layer. Forming the one or more device terminal further includes forming a gate electrode and at least one source/drain terminal coupled to the polarization layer proximal to the (0001) surface, forming a second gate electrode and at least a second source/drain terminal coupled to the second III-N semiconductor device layer proximal to the (000–1) surface.

In furtherance of the fifth embodiments, the method further includes forming a MOSFET in a second region of the silicon substrate.

In furtherance of the fifth embodiments, the method further includes thinning the silicon substrate no more than 25 μm.

In furtherance of embodiment immediately above, the method further comprises depositing a flowable dielectric around the silicon mesas.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A semiconductor device structure, comprising:
    a mesa over a substrate comprising a first crystal, the first crystal comprising silicon, the mesa having a top surface at a first z-height from a bottom of the mesa;
    a second crystal comprising a first III-N material, the second crystal over the top surface of the mesa with a c-axis of the second crystal substantially orthogonal to the top surface, the second crystal comprising a peripheral region that extends laterally beyond a sidewall of the mesa;
    a second III-N material over the first III-N material, the second III-N material having a composition different from a composition of the first III-N material; and
    a monocrystalline material comprising silicon on the substrate and adjacent to the mesa, wherein the monocrystalline material has a second z-height, relative to the bottom of the mesa, that is greater than the first z-height.

2. The semiconductor device structure of claim 1, wherein the second III-N material is over at least one of a (0001) or a (000–1) surface of the first III-N material.

3. The semiconductor device structure of claim 2, wherein the second crystal has a sidewall surface with an m-plane and the second III-N material is over both a (0001) and a (000–1) surface of the first III-N material.

4. The semiconductor device structure of claim 1, wherein:
    the first z-height is at least 500 nm;
    the second crystal has a maximum z-thickness over the top surface that is no more than 500 nm; and
    the peripheral region extends laterally beyond the sidewall by at least 500 μm.

5. The semiconductor device structure of claim 4, wherein:
    a minimum lateral width of the mesa is between 500 μm and 1 μm;
    the first z-height is between 750 μm and 5 μm; and
    a third III-N material is over the second III-N material, the third III-N material having a composition sufficiently distinct from that of the second III-N material to maintain a two-dimensional electron gas (2DEG) within the third III-N material.

6. The semiconductor device structure of claim 1, wherein:
    the second crystal has a sidewall with an m-plane; and
    the second III-N material is over the m-plane.

7. The semiconductor device structure of claim 1, wherein:
    a core portion of the second crystal over the top surface of the mesa has a first density of threading dislocations extending from the top surface of the mesa through a z-height of the second crystal; and
    the peripheral region has a second density of threading dislocations that is at least an order of magnitude lower than the first density of threading dislocations.

8. The semiconductor device structure of claim 7, wherein:
    the mesa has a lateral width proximal to the second crystal, the lateral width being smaller than that of the core portion of the second crystal; and
    an exposed region of the core portion of the second crystal is substantially free of the second 111-N material.

9. The semiconductor device structure of claim 1, wherein:
    the first III-N material comprises predominantly Ga and N with a c-plane no more than 10° from parallel to a (100) plane of the substrate; and
    the second III-N material comprises more Al than the first III-N material.

10. A semiconductor device, comprising:
    a semiconductor structure including:
        a mesa comprising a first crystal, the first crystal comprising silicon;

a second crystal comprising a first III-N material, the second crystal over a top surface of the mesa with a c-axis of the second crystal substantially orthogonal to the top surface, the second crystal comprising a peripheral region that extends laterally beyond a sidewall of the mesa; and a second III-N material over the first material, the second III-N material having a composition different than that of the first material; and one or more device terminals coupled to the semiconductor structure, wherein the one or more device terminals further comprise a gate terminal disposed between a source terminal and a drain terminal, at least the gate terminal located within the peripheral region.

11. The device of claim 10, wherein:

the second III-N material comprises a two-dimensional electron gas (2DEG) in at least a portion of the peripheral region; and the gate terminal is to modulate the 2DEG.

12. The device of claim 11, wherein:

the second III-N material is over a (0001) surface of the second crystal and over a (000−1) surface of the second crystal;

a third III-N material is over a (000−1) surface of the second III-N material, the third III-N material comprising a second 2DEG within the third III-N material; and the one or more device terminals further comprise a second gate terminal between a second source terminal and a second drain terminal, at least the second gate terminal located within the peripheral region to modulate the second 2DEG.

13. The semiconductor device structure of claim 1, wherein:

the second III-N material is a layer of a light emitting diode (LED) stack, the LED stack covering at least one of a (0001) or a (000−1) surface of the peripheral region.

* * * * *